(12) United States Patent
Yang et al.

(10) Patent No.: US 7,638,356 B2
(45) Date of Patent: Dec. 29, 2009

(54) CONTROLLED GROWTH OF LARGER HETEROJUNCTION INTERFACE AREA FOR ORGANIC PHOTOSENSITIVE DEVICES

(75) Inventors: Fan Yang, Somerset, NJ (US); Stephen R. Forrest, Ann Arbor, MI (US)

(73) Assignees: The Trustees of Princeton University, Princeton, NJ (US); The Regents of the University of Michigan, Ann Arbor, MI (US)

( * ) Notice: Subject to any disclaimer, the term of this patent is extended or adjusted under 35 U.S.C. 154(b) by 675 days.

(21) Appl. No.: 11/483,641

(22) Filed: Jul. 11, 2006

(65) Prior Publication Data

US 2008/0012005 A1    Jan. 17, 2008

(51) Int. Cl.
   *H01L 51/00*    (2006.01)
(52) U.S. Cl. .................. 438/82; 257/759; 257/E51.019
(58) Field of Classification Search .................... 257/40, 257/759, E51.019; 438/82, 99
   See application file for complete search history.

(56) References Cited

U.S. PATENT DOCUMENTS

| | | | |
|---|---|---|---|
| 6,300,559 B1 * | 10/2001 | Ohmori | ...................... 136/263 |
| 6,333,458 B1 | 12/2001 | Forrest et al. | |
| 6,352,777 B1 | 3/2002 | Bulovic et al. | |
| 6,420,031 B1 | 7/2002 | Parthasarathy et al. | |
| 6,440,769 B2 | 8/2002 | Peumans et al. | |
| 6,451,415 B1 | 9/2002 | Forrest et al. | |

(Continued)

FOREIGN PATENT DOCUMENTS

WO     WO 2005/101524 A2    10/2005

(Continued)

OTHER PUBLICATIONS

Peumans et al., "Efficient photon harvesting at high optical intensities in ultrathin organic double-heterostructure photovoltaic diodes", Appl. Phys. Lett. 76: 2650-2652, 2000.

(Continued)

*Primary Examiner*—Allan R. Wilson
(74) *Attorney, Agent, or Firm*—McDermott Will & Emery LLP

(57) ABSTRACT

An optoelectronic device and a method of fabricating a photosensitive optoelectronic device includes depositing a first organic semiconductor material on a first electrode to form a continuous first layer having protrusions, a side of the first layer opposite the first electrode having a surface area at least three times greater than an underlying lateral cross-sectional area; depositing a second organic semiconductor material directly on the first layer to form a discontinuous second layer, portions of the first layer remaining exposed; depositing a third organic semiconductor material directly on the second layer to form a discontinuous third layer, portions of at least the second layer remaining exposed; depositing a fourth organic semiconductor material on the third layer to form a continuous fourth layer, filling any exposed gaps and recesses in the first, second, and third layers; and depositing a second electrode on the fourth layer, wherein at least one of the first electrode and the second electrode is transparent, and the first and third organic semiconductor materials are both of a donor-type or an acceptor-type relative to second and fourth organic semiconductor materials, which are of the other material type.

24 Claims, 8 Drawing Sheets

U.S. PATENT DOCUMENTS

| | | |
|---|---|---|
| 6,580,027 B2 | 6/2003 | Forrest et al. |
| 6,657,378 B2 | 12/2003 | Forrest et al. |
| 6,995,035 B2 * | 2/2006 | Cok et al. ............... 438/82 |
| 7,087,831 B2 * | 8/2006 | Den et al. ............... 136/250 |
| 7,419,846 B2 * | 9/2008 | Shtein et al. ............ 438/82 |
| 2004/0048000 A1 | 3/2004 | Shtein |
| 2005/0110007 A1 | 5/2005 | Forrest et al. |
| 2005/0224113 A1 | 10/2005 | Xue et al. |
| 2005/0227390 A1 | 10/2005 | Shtein et al. |
| 2005/0266218 A1 | 12/2005 | Peumans et al. |
| 2006/0027802 A1 | 2/2006 | Forrest et al. |
| 2006/0032529 A1 | 2/2006 | Rand et al. |
| 2007/0215868 A1 * | 9/2007 | Forrest et al. ........... 257/40 |
| 2008/0116536 A1 * | 5/2008 | Forrest et al. ........... 257/431 |

FOREIGN PATENT DOCUMENTS

| | | |
|---|---|---|
| WO | WO 2005/101524 A3 | 10/2005 |

OTHER PUBLICATIONS

Miessler et al., "Inorganic Chemistry", $2^{nd}$ Edition, Prentice Hall, Chapter 13, 1999.

Yang et al., "Controlled growth of a molecular bulk heterojunction photovoltaic cell", Nature Mater. 4: 37-41, 2005.

Forrest, "Ultrathin organic films grown by organic molecular beam deposition and related techniques", Chemical Reviews 97(6): 1793-1896, 1997.

International Search Report and Written Opinion of the International Searching Authority for PCT Application Serial No. PCT/US07/15809, mailed on Aug. 11, 2008.

* cited by examiner

- Organic 4  952b
- Organic 3  953a
- Organic 2  952a
- Organic 1  951
- Electrode 1  920
- Substrate  110

- Organic 5  953b
- Organic 4  952b
- Organic 3  953a
- Organic 2  952a
- Organic 1  951
- Electrode 1  920
- Substrate  110

- Organic 6  954
- Organic 5  953b
- Organic 4  952b
- Organic 3  953a
- Organic 2  952a
- Organic 1  951
- Electrode 1  920
- Substrate  110

US 7,638,356 B2

CONTROLLED GROWTH OF LARGER HETEROJUNCTION INTERFACE AREA FOR ORGANIC PHOTOSENSITIVE DEVICES

UNITED STATES GOVERNMENT RIGHTS

This invention was made with government support under contact DE-AC36-98-GO10337 and sub-contract XAT-5-33636-03 awarded by U.S. Department of Energy, National Renewable Energy Laboratory. The government has certain rights in the invention.

JOINT RESEARCH AGREEMENT

The claimed invention was made by, on behalf of, and/or in connection with one or more of the following parties to a joint university-corporation research agreement: Princeton University, The University of Southern California, and Global Photonic Energy Corporation. The agreement was in effect on and before the date the claimed invention was made, and the claimed invention was made as a result of activities undertaken within the scope of the agreement.

FIELD OF THE INVENTION

The present invention generally relates to organic photosensitive optoelectronic devices. More specifically, it is directed to organic photosensitive optoelectronic devices having bulk donor-acceptor heterojunctions.

BACKGROUND

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into an electrical signal or electricity. Solar cells, also called photovoltaic ("PV") devices, are a type of photosensitive optoelectronic device that is specifically used to generate electrical power. Photoconductor cells are a type of photosensitive optoelectronic device that are used in conjunction with signal detection circuitry which monitors the resistance of the device to detect changes due to absorbed light. Photodetectors, which may receive an applied bias voltage, are a type of photosensitive optoelectronic device that are used in conjunction with current detecting circuits which measures the current generated when the photodetector is exposed to electromagnetic radiation.

These three classes of photosensitive optoelectronic devices may be distinguished according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias.

As used herein, the term "rectifying" denotes, inter alia, that an interface has an asymmetric conduction characteristic, i.e., the interface supports electronic charge transport preferably in one direction. The term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct (i.e., transport) electric charge in a material. The term "photoconductive material" refers to semiconductor materials which are utilized for their property of absorbing electromagnetic radiation to generate electric charge carriers. As used herein, "top" means furthest away from the substrate, while "bottom" means closest to the substrate. There may be intervening layers (for example, if a first layer is "on" or "over" a second layer), unless it is specified that the first layer is "in physical contact with" or "directly on" the second layer; however, this does not preclude surface treatments (e.g., exposure of the first layer to ultraviolet-ozone or a plasma).

When electromagnetic radiation of an appropriate energy is incident upon an organic semiconductor material, a photon can be absorbed to produce an excited molecular state. In organic photoconductive materials, the generated molecular state is generally believed to be an "exciton," i.e., an electron-hole pair in a bound state which is transported as a quasi-particle. An exciton can have an appreciable life-time before geminate recombination ("quenching"), which refers to the original electron and hole recombining with each other (as opposed to recombination with holes or electrons from other pairs). To produce a photocurrent, the electron-hole forming the exciton are typically separated at a rectifying junction.

In the case of photosensitive devices, the rectifying junction is referred to as a photovoltaic heterojunction. Types of organic photovoltaic heterojunctions include a donor-acceptor heterojunction formed at an interface of a donor material and an acceptor material, and a Schottky-barrier heterojunction formed at the interface of a photoconductive material and a metal.

FIG. 1 is an energy-level diagram illustrating an example donor-acceptor heterojunction. In the context of organic materials, the terms "donor" and "acceptor" refer to the relative positions of the Highest Occupied Molecular Orbital ("HOMO") and Lowest Unoccupied Molecular Orbital ("LUMO") energy levels of two contacting but different organic materials. If the LUMO energy level of one material in contact with another is lower, then that material is an acceptor. Otherwise it is a donor. It is energetically favorable, in the absence of an external bias, for electrons at a donor-acceptor junction to move into the acceptor material.

As used herein, a first HOMO or LUMO energy level is "greater than" or "higher than" a second HOMO or LUMO energy level if the first energy level is closer to the vacuum energy level 10. A higher HOMO energy level corresponds to an ionization potential ("IP") having a smaller absolute energy relative to a vacuum level. Similarly, a higher LUMO energy level corresponds to an electron affinity ("EA") having a smaller absolute energy relative to vacuum level. On a conventional energy level diagram, with the vacuum level at the top, the LUMO energy level of a material is higher than the HOMO energy level of the same material.

After absorption of a photon 6 in the donor 152 or the acceptor 154 creates an exciton 8, the exciton 8 disassociates at the rectifying interface. The donor 152 transports the hole (open circle) and the acceptor 154 transports the electron (dark circle).

A significant property in organic semiconductors is carrier mobility. Mobility measures the ease with which a charge carrier can move through a conducting material in response to an electric field. In the context of organic photosensitive devices, a material that conducts preferentially by electrons due to a high electron mobility may be referred to as an electron transport material. A material that conducts preferentially by holes due to a high hole mobility may be referred to as a hole transport material. A layer that conducts preferentially by electrons, due to mobility and/or position in the device, may be referred to as an electron transport layer ("ETL"). A layer that conducts preferentially by holes, due to mobility and/or position in the device, may be referred to as a hole transport layer ("HTL"). Preferably, but not necessarily, an acceptor material is an electron transport material and a donor material is a hole transport material.

How to pair two organic photoconductive materials to serve as a donor and an acceptor in a photovoltaic heterojunction based upon carrier mobilities and relative HOMO and LUMO levels is well known in the art, and is not addressed here.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule." In general, a small molecule has a defined chemical formula with a molecular weight that is the same from molecule to molecule, whereas a polymer has a defined chemical formula with a molecular weight that may vary from molecule to molecule. As used herein, "organic" includes metal complexes of hydrocarbyl and heteroatom-substituted hydrocarbyl ligands.

For additional background explanation and description of the state of the art for organic photosensitive devices, including their general construction, characteristics, materials, and features, U.S. Pat. No. 6,657,378 to Forrest et al., U.S. Pat. No. 6,580,027 to Forrest et al., and U.S. Pat. No. 6,352,777 to Bulovic et al. are incorporated herein by reference.

SUMMARY OF THE INVENTION

A method of fabricating a photosensitive optoelectronic device according to an embodiment of the present invention includes depositing a first organic semiconductor material on a first electrode to form a continuous first layer having protrusions, a side of the first layer opposite the first electrode having a surface area at least three times greater than an underlying lateral cross-sectional area; depositing a second organic semiconductor material directly on the first layer to form a discontinuous second layer, portions of the first layer remaining exposed; depositing a third organic semiconductor material directly on the second layer to form a discontinuous third layer, portions of at least the second layer remaining exposed; depositing a fourth organic semiconductor material on the third layer to form a continuous fourth layer, filling any exposed gaps and recesses in the first, second, and third layers; and depositing a second electrode on the fourth layer, wherein at least one of the first electrode and the second electrode is transparent, and the first and third organic semiconductor materials are both of a donor-type or an acceptor-type relative to second and fourth organic semiconductor materials, which are of the other material type.

Portions of the third layer may directly contact the first layer through gaps in the second layer, and portions of the fourth layer may directly contact the second layer through gaps in the third layer.

Preferably, from any point within the first layer, a distance to an interface boundary with a layer of an opposite material type is no more than 2.5 exciton diffusion lengths of the first organic semiconductor material, and from any point with the second layer, a distance to an interface boundary with a layer of an opposite material type is no more than 1.5 exciton diffusion lengths of the second organic semiconductor material, and from any point with the third layer, a distance to an interface boundary with a layer of an opposite material type is no more than 1.5 exciton diffusion lengths of the third organic semiconductor material, and from any point in the fourth layer, a distance to an interface boundary with a layer of opposite material type is no more than 2.5 exciton diffusion lengths of the fourth organic semiconductor material.

Preferably, the surface area of the side of the first layer opposite from the first electrode is at least three times greater than a surface area of a side of the first layer facing the first electrode, and/or the side of the first layer opposite the first electrode may have a surface area at least five times greater than the underlying lateral cross-sectional area.

The first organic semiconductor material and the third organic semiconductor material may be a same material, and the second organic semiconductor material and the fourth organic semiconductor material may be a same material. Alternatively, the first organic semiconductor material and the third organic semiconductor material may be a different material, and the second organic semiconductor material and the fourth organic semiconductor material may be a different material. Or the first and the third may be the same, and the second and fourth may be different. Or the first and the third may be different, and the second and fourth may be the same.

Depositing the first organic semiconductor material may include delivery of a vapor of the first organic semiconductor material in an inert carrier gas. Preferably, the first electrode has an exposed surface having a root mean square roughness of at least 30 nm and a height variation of at least 200 nm.

A photosensitive optoelectronic device according to an embodiment of the present invention includes a first electrode and a second electrode and a plurality of organic photoactive layers disposed between the first electrode and the second electrode. At least one of the first electrode and the second electrode being transparent. The plurality of organic photoactive layers include a first layer consisting essentially of a first organic semiconductor material, the first layer being continuous and having protrusions, a side of the first layer that faces a second layer having a surface area at least three times greater than a lateral cross-sectional area; the second layer consisting essentially of a second organic semiconductor material, the second layer being discontinuous and in direct contact with the first layer, portions of the first layer coinciding with gaps in the second layer; a third layer consisting essentially of a third organic semiconductor material, the third layer being discontinuous and in direct contact with the second layer, portions of the second layer coinciding with gaps in the third layer; and a fourth layer consisting essentially of a fourth organic semiconductor material, the fourth layer being continuous and on the third layer, the fourth layer filling gaps and recesses in the other organic photoactive layers if the gaps and recesses are exposed to the fourth layer. The first and third organic semiconductor materials are both of a donor-type or an acceptor-type relative to second and fourth organic semiconductor materials, which are of the other material type.

Portions of the third layer may be in direct contact with the first layer through gaps in the second layer, and portions of the fourth layer may be in direct contact with the second layer through gaps in the third layer.

Preferably, from any point within the first layer, a distance to an interface boundary with a layer of an opposite material type is no more than 2.5 exciton diffusion lengths of the first organic semiconductor material; from any point with the second layer, a distance to an interface boundary with a layer of an opposite material type is no more than 1.5 exciton diffusion lengths of the second organic semiconductor material; from any point with the third layer, a distance to an interface boundary with a layer of an opposite material type is no more than 1.5 exciton diffusion lengths of the third organic semiconductor material; and from any point in the fourth layer, a distance to an interface boundary with a layer of opposite material type is no more than 2.5 exciton diffusion lengths of the fourth organic semiconductor material.

The surface area of the side of the first layer facing the second layer is preferably at least three times greater than a surface area of an opposite side of the first layer, and/or the side of the first layer that faces the second layer having a surface area at least five times greater than a lateral cross-sectional area.

The first organic semiconductor material and the third organic semiconductor material may be a same material, and the second organic semiconductor material and the fourth organic semiconductor material may be a same material. Alternatively, the first organic semiconductor material and the third organic semiconductor material may be a different material, and the second organic semiconductor material and the fourth organic semiconductor material may be a different material. Or the first and the third may be the same, and the second and fourth may be different. Or the first and the third may be different, and the second and fourth may be the same.

One of the first electrode and the second electrode may be an anode and the other may be a cathode. Among the plurality of organic photoactive layers, a respective organic semiconductor material of each donor-type layer that is closer to the anode preferably has a HOMO no more than 0.026 eV lower than that of an adjacent donor-type layer further from the anode, and a respective organic semiconductor material of each acceptor-type layer that is closer to the cathode preferably has a LUMO no more than 0.026 eV higher than that of an adjacent acceptor-type material further from cathode. More preferably, among the plurality of organic photoactive layers, a respective organic semiconductor material of each donor-type layer that is closer to the anode has a HOMO that is equal to or higher than that of an adjacent donor-type layer further from the anode, and a respective organic semiconductor material of each acceptor-type layer that is closer to the cathode has a LUMO that is equal to or lower than that of an adjacent acceptor-type material further from the cathode.

Preferably, the first electrode may have an upper surface having a root mean square roughness of at least 30 nm and a height variation of at least 200 nm.

The plurality of organic photoactive layers may further include a fifth layer and a sixth layer between the third layer and the fourth layer. The fifth layer consists essentially of a fifth organic semiconductor material, the fifth layer being discontinuous and in direct contact with the third layer, portions of the third layer coinciding with gaps in the fifth layer. The sixth layer consists essentially of a sixth organic semiconductor material, the sixth layer being discontinuous and in direct contact with the fifth layer, portions of the fifth layer coinciding with gaps in the sixth layer. The fifth organic semiconductor material is of same material type as the first and third organic semiconductor materials, the sixth organic semiconductor material being of the other material type.

The figures are not necessarily drawn to scale.

DETAILED DESCRIPTION

Figure 1:
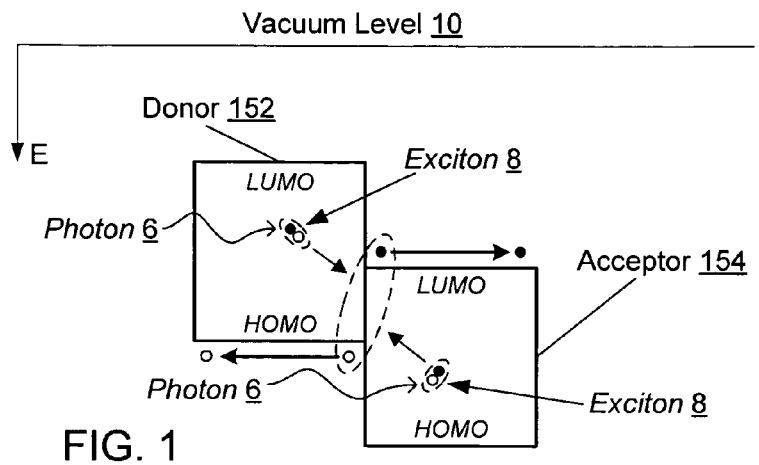
FIG. 1 is an energy level diagram illustrating a donor-acceptor heterojunction.
Figure 2:
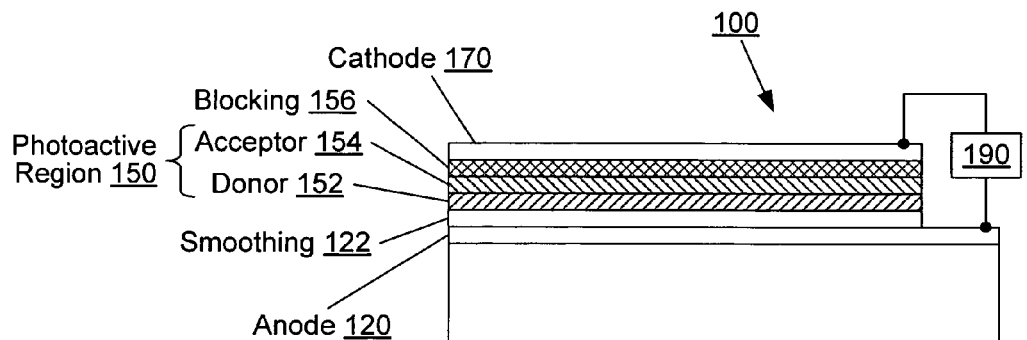
FIG. 2 illustrates an organic photosensitive device including a donor-acceptor heterojunction.

An organic photosensitive device comprises at least one photoactive region in which light is absorbed to form an exciton, which may subsequently dissociate into an electron and a hole. FIG. 2 shows an example of an organic photosensitive optoelectronic device 100 in which the photoactive region 150 comprises a donor-acceptor heterojunction. The "photoactive region" is a portion of a photosensitive device that absorbs electromagnetic radiation to generate excitons that may dissociate in order to generate an electrical current. Device 100 comprises an anode 120, an anode smoothing layer 122, a donor 152, an acceptor 154, an exciton blocking layer ("EBL") 156, and a cathode 170, over a substrate 110.

Examples of EBL 156 are described in U.S. Pat. No. 6,451,415 to Forrest et al., which is incorporated herein by reference for its disclosure related to EBLs. Additional background explanation of EBLs may also be found in Peumans et al., "Efficient photon harvesting at high optical intensities in ultrathin organic double-heterostructure photovoltaic diodes," *Applied Physics Letters* 76, 2650-52 (2000). EBLs reduce quenching by preventing excitons from migrating out of the donor and/or acceptor materials.

The terms "electrode" and "contact" are used interchangeably herein to refer to a layer that provides a medium for delivering photo-generated current to an external circuit or providing a bias current or voltage to the device. As illustrated in FIG. 2, anode 120 and cathode 170 are examples. Electrodes may be composed of metals or "metal substitutes." Herein the term "metal" is used to embrace both materials composed of an elementally pure metal, and also metal alloys which are materials composed of two or more elementally pure metals. The term "metal substitute" refers to a material that is not a metal within the normal definition, but which has the metal-like properties such as conductivity, such as doped wide-bandgap semiconductors, degenerate semiconductors, conducting oxides, and conductive polymers. Electrodes may comprise a single layer or multiple layers (a "compound" electrode), may be transparent, semi-transparent, or opaque.

Examples of electrodes and electrode materials include those disclosed in U.S. Pat. No. 6,352,777 to Bulovic et al., and U.S. Pat. No. 6,420,031, to Parthasarathy, et al., each incorporated herein by reference for disclosure of these respective features. As used herein, a layer is said to be "transparent" if it transmits at least 50% of the ambient electromagnetic radiation in a relevant wavelength.

The substrate 110 may be any suitable substrate that provides desired structural properties. The substrate may be flexible or rigid, planar or non-planar. The substrate may be transparent, translucent or opaque. Rigid plastics and glass are examples of preferred rigid substrate materials. Flexible plastics and metal foils are examples of preferred flexible substrate materials.

An anode-smoothing layer 122 may be situated between the anode layer 120 and the donor layer 152. Anode-smoothing layers are described in U.S. Pat. 6,657,378 to Forrest et al., incorporated herein by reference for its disclosure related to this feature.

In FIG. 2, the photoactive region 150 comprises the donor material 152 and the acceptor material 154. Organic materials for use in the photoactive region may include organometallic compounds, including cyclometallated organometallic compounds. The term "organometallic" as used herein is as generally understood by one of ordinary skill in the art and as given, for example, in Chapter 13 of "Inorganic Chemistry" (2nd Edition) by Gary L. Miessler and Donald A. Tarr, Prentice Hall (1999).

Organic layers may be fabricated using vacuum deposition, spin coating, organic vapor-phase deposition, inkjet printing, organic vapor jet printing and other methods known in the art.

Figure 3:
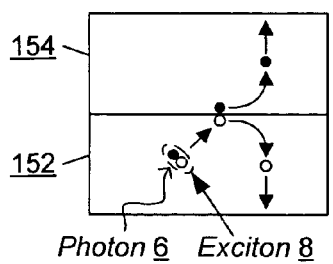
FIG. 3 illustrates a donor-acceptor bilayer forming a planar heterojunction.
Figure 4:
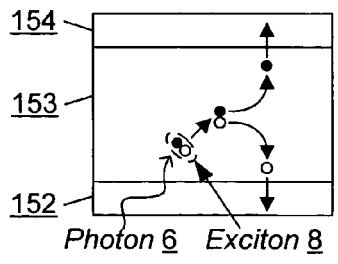
FIG. 4 illustrates a hybrid heterojunction including a mixed heterojunction between a donor layer and an acceptor layer.
Figure 5:
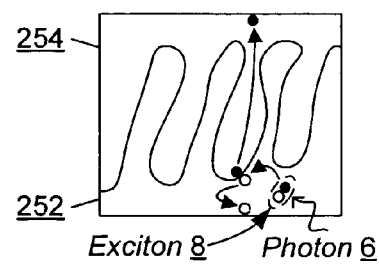
FIG. 5 illustrates a bulk heterojunction.

Examples of various types of donor-acceptor heterojunctions are shown in FIGS. 3-5. FIG. 3 illustrates a donor-acceptor bilayer forming a planar heterojunction. FIG. 4 illustrates a hybrid heterojunction including a mixed heterojunction 153 comprising a mixture of donor and acceptor materials. FIG. 5 illustrates an idealized "bulk" heterojunction. A bulk heterojunction, in the ideal photocurrent case, has a single continuous interface between the donor material 252 and the acceptor material 254, although multiple interfaces typically exist in actual devices. Mixed and bulk heterojunctions can have multiple donor-acceptor interfaces as a result of having plural domains of material. Domains that are surrounded by the opposite-type material (e.g., a domain of donor material surrounded by acceptor material) may be electrically isolated, such that these domains do not contribute to photocurrent. Other domains may be connected by percolation pathways (continuous photocurrent pathways), such that these other domains may contribute to photocurrent. The distinction between a mixed and a bulk heterojunction lies in degrees of phase separation between donor and acceptor materials. In a mixed heterojunction, there is very little or no phase separation (the domains are very small, e.g., less than a few nanometers), whereas in a bulk heterojunction, there is significant phase separation (e.g., forming domains with sizes of a few nanometers to 100 nm).

Small-molecule mixed heterojunctions may be formed, for example, by co-deposition of the donor and acceptor materials using vacuum deposition or vapor deposition. Small-molecule bulk heterojunctions may be formed, for example, by controlled growth, co-deposition with post-deposition annealing, or solution processing. Polymer mixed or bulk heterojunctions may be formed, for example, by solution processing of polymer blends of donor and acceptor materials.

If a photoactive region includes a mixed layer (153) or bulk layers (252, 254) and one or both of the donor (152) and acceptor layers (154), the photoactive region is said to include a "hybrid" heterojunction. The arrangement of layers in FIG. 4 is an example. For additional explanation of hybrid heterojunctions, Published U.S. Patent Application 2005/0224113 A1, entitled "High efficiency organic photovoltaic cells employing hybridized mixed-planar heterojunctions" by Jiangeng Xue et al., published Oct. 13, 2005, is hereby incorporated by reference.

In general, planar heterojunctions have good carrier conduction, but poor exciton dissociation; a mixed layer has poor carrier conduction and good exciton dissociation, and a bulk heterojunction has good carrier conduction and good exciton dissociation, but may experience charge build-up at the end of the material "cul-de-sacs," lowering efficiency. Unless otherwise stated, planar, mixed, bulk, and hybrid heterojunctions may be used interchangeably as donor-acceptor heterojunctions throughout the embodiments disclosed herein.

Figure 6:
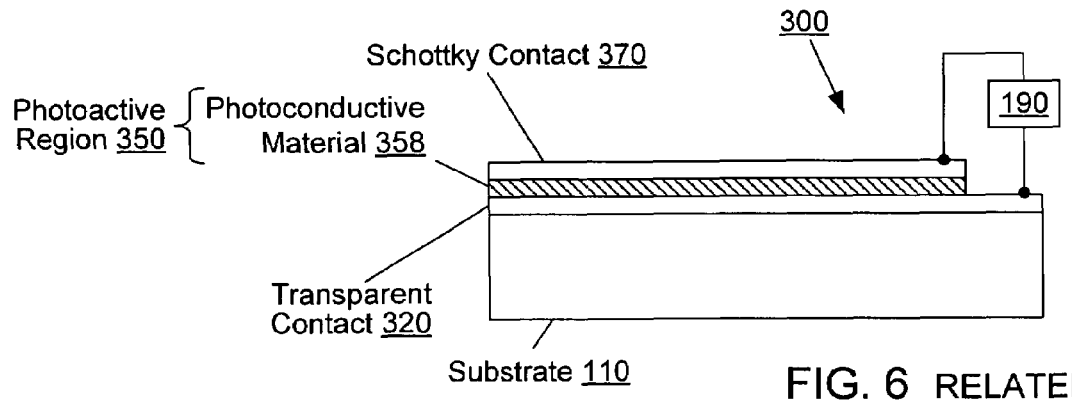
FIG. 6 illustrates an organic photosensitive device including a Schottky-barrier heterojunction.

FIG. 6 shows an example of a organic photosensitive optoelectronic device 300 in which the photoactive region 350 is part of a Schottky-barrier heterojunction. Device 300 comprises a transparent contact 320, a photoactive region 350 comprising an organic photoconductive material 358, and a Schottky contact 370. The Schottky contact 370 is typically formed as a metal layer. If the photoconductive layer 358 is an ETL, a high work function metal such as gold may be used, whereas if the photoconductive layer is an HTL, a low work function metal such as aluminum, magnesium, or indium may be used. In a Schottky-barrier cell, a built-in electric field associated with the Schottky barrier pulls the electron and hole in an exciton apart. Generally, this field-assisted exciton dissociation is not as efficient as the disassociation at a donor-acceptor interface.

The devices as illustrated may be connected to an element 190. If the device is a photovoltaic device, element 190 is a resistive load which consumes or stores power. If the device is a photodetector, element 190 is a current detecting circuit which measures the current generated when the photodetector is exposed to light, and which may apply a bias to the device (as described for example in Published U.S. Patent Application 2005-0110007 A1, published May 26, 2005 to Forrest et al.). If the rectifying junction is eliminated from the device (e.g., using a single photoconductive material as the photoactive region), the resulting structures may be used as a photoconductor cell, in which case the element 190 is a signal detection circuit to monitor changes in resistance across the device due to the absorption of light. Unless otherwise stated, each of these arrangements and modifications may be used for the devices in each of the drawings and embodiments disclosed herein.

An organic photosensitive optoelectronic device may also comprise transparent charge transfer layers, electrodes, or charge recombination zones. A charge transfer layer may be organic or inorganic, and may or may not be photoconductively active. A charge transfer layer is similar to an electrode, but does not have an electrical connection external to the device and only delivers charge carriers from one subsection of an optoelectronic device to the adjacent subsection. A charge recombination zone is similar to a charge transfer layer, but allows for the recombination of electrons and holes between adjacent subsections of an optoelectronic device. A charge recombination zone may include semi-transparent metal or metal substitute recombination centers comprising nanoclusters, nanoparticles, and/or nanorods, as described for example in U.S. Pat. No. 6,657,378 to Forrest et al.; Published U.S. Patent Application 2006-0032529 A1, entitled "Organic Photosensitive Devices" by Rand et al., published Feb. 16, 2006; and Published U.S. Patent Application 2006-0027802 A1, entitled "Stacked Organic Photosensitive Devices" by Forrest et al., published Feb. 9, 2006; each incorporated herein by reference for its disclosure of recombination zone materials and structures. A charge recombination zone may or may not include a transparent matrix layer in which the recombination centers are embedded. A charge transfer layer, electrode, or charge recombination zone may serve as a cathode and/or an anode of subsections of the optoelectronic device. An electrode or charge transfer layer may serve as a Schottky contact.

Figure 7:
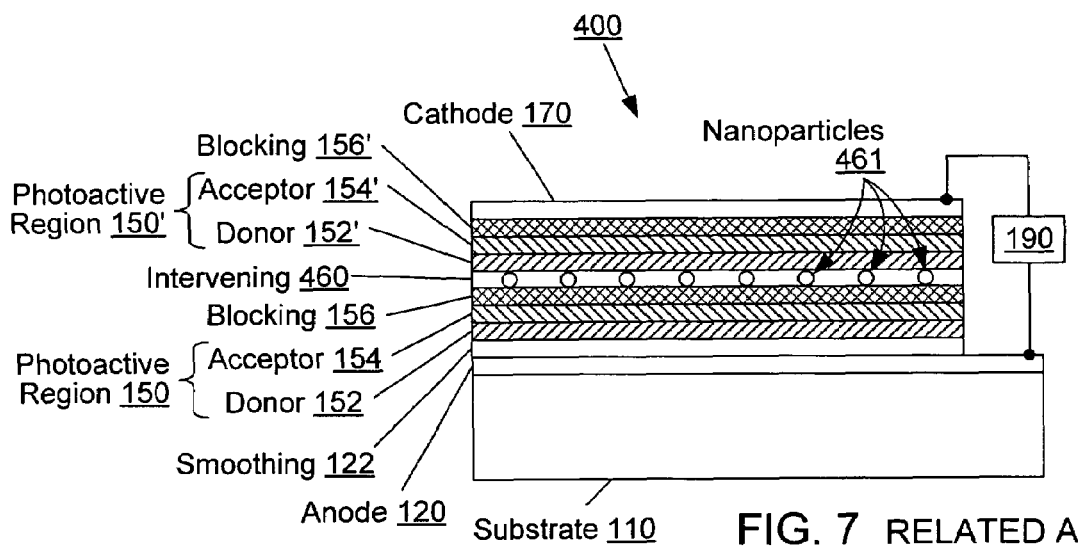
FIG. 7 illustrates tandem photosensitive cells in series.
Figure 8:
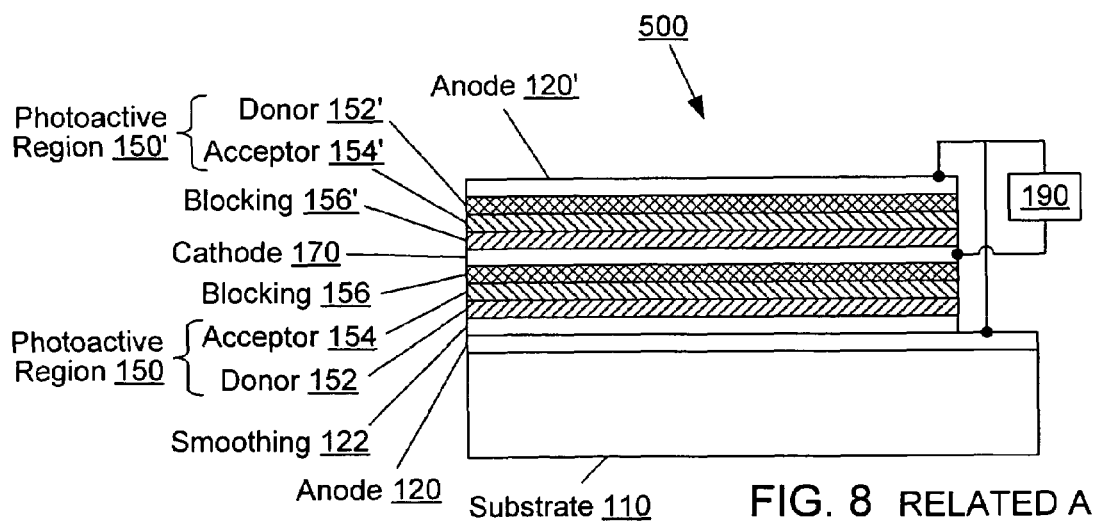
FIG. 8 illustrates tandem photosensitive cells in parallel.

FIGS. 7 and 8 illustrate examples of tandem devices including such transparent charge transfer layers, electrodes, and charge recombination zones. In device 400 in FIG. 7, photoactive regions 150 and 150' are stacked electrically in series with an intervening conductive region 460. As illustrated without external electrical connections, intervening conductive region 460 may be a charge recombination zone or may be a charge transfer layer. As a recombination zone, region 460 comprises recombination centers 461 with or without a transparent matrix layer. If there is no matrix layer, the arrangement of material forming the zone may not be continuous across the region 460. Device 500 in FIG. 8 illustrates photoactive regions 150 and 150' stacked electrically in parallel, with the top cell being in an inverted configuration (i.e., cathode-down). In each of FIGS. 7 and 8, the photoactive regions 150 and 150' and blocking layers 156 and 156' may be formed out of the same respective materials, or different materials, depending upon the application. Likewise, photoactive regions 150 and 150' may be a same type (i.e., planar, mixed, bulk, hybrid) of heterojunction, or may be of different types.

In each of the devices described above, layers may be omitted, such as the smoothing layer and the exciton blocking layers. Other layers may be added, such as reflective layers or additional photoactive regions. The order of layers may be altered or inverted. A concentrator or trapping configuration may be employed to increase efficiency, as disclosed, for example in U.S. Pat. No. 6,333,458 to Forrest et al. and U.S. Pat. No. 6,440,769 to Peumans et al., which are incorporated herein by reference. Coatings may be used to focus optical energy into desired regions of a device, as disclosed, for example in Published US Patent Application No. 2005-0266218 A1, entitled "Aperiodic dielectric multilayer stack" by Peumans et al., published Dec. 1, 2005, which is incorporated herein by reference. In the tandem devices, transparent insulative layers may be formed between cells, with the electrical connection between the cells being provided via electrodes. Also in the tandem devices, one or more of the photoactive regions may be a Schottky-barrier heterojunction instead of a donor-acceptor heterojunction. Arrangements other than those specifically described may be used.

Efforts have focused on the use of organic photovoltaic cells to achieve acceptable photovoltaic conversion efficiencies with economical production costs. Efficient dissociation of excitons in organic materials occurs under strong electric fields, or at a donor-acceptor heterojunction where the differences in the electron affinities and ionization potentials between the contacting organic materials are sufficiently large to overcome the exciton binding energy. The latter mechanism has been employed to form donor-acceptor heterojunction photovoltaic cells with a power conversion efficiency $\eta_P \sim 1\%$, and is limited by exciton diffusion lengths ($L_D \sim 10$-$40$ nm) being much shorter than the optical absorption length ($L_A \sim 100$ nm). The organic materials used for solar cells usually absorb more than 90% of the incident light with a thickness of 100 nm.

Excitons generated within an exciton diffusion length of a donor-acceptor heterojunction have a high probability of disassociating efficiently at the heterojunction. Conversely, excitons generated more than an exciton diffusion length from the donor-acceptor heterojunction generally are unlikely to disassociate efficiently and to contribute to photocurrent.

As described above with FIG. 5, bulk heterojunctions were developed in an effort to maximize the proximity a donor-acceptor heterojunction to an exciton. Bulk heterojunctions preferably have a highly interfolded or inter-percolated network of donor and acceptor materials such that an exciton generated by the absorption of incident radiation is likely close to a heterojunction, and therefore, is likely to contribute to photocurrent.

Early bulk heterojunctions were fabricated by spin coating a mixture of soluble versions of the donor and acceptor materials, followed by phase segregation of the mixture by high temperature annealing. During the spin coating and solvent evaporation, the donor and acceptor materials phase separate, creating an intricate inter-penetrating network with a large interfacial area between the two phases. The morphology of the resulting structure was controlled by changing the spin conditions, solvents, and relative material concentrations. Although bulk heterojunctions formed by spin-coat methods exhibited improved power conversion efficiencies over traditional bilayer designs, the bulk devices exhibited a high series resistance due to the disordered structure of the interface layer. Phase separation during spin coating and annealing-induced phase segregation are both thermodynamically driven methods characterized by randomly structured inter-digitation between the donor and acceptor layers due to the entropy of the interface formation process.

The performance of bulk devices was improved by switching from spin coating to organic vapor phase deposition (OVPD), as described in U.S. Patent Application Publication 2005/0227390 A1 to Shtein et al. entitled "Method of Fabricating An Optoelectronic Device Having A Bulk Heterojunction", and in "Controlled growth of a molecular bulk heterojunction photovoltaic cell" by Yang et al., Nature Materials Vol. 4, 37-41 (2005), both of which are incorporated herein by reference.

OVPD is inherently different from the widely used vacuum thermal evaporation (VTE) in that OVPD uses a carrier gas to transport vapors into a deposition chamber. Spatially separating the functions of evaporation and transport leads to precise control over the deposition process, and enabling control over the organic surface morphology, e.g., flat with smooth surface or layers with protrusions. Another feature of OVPD, compared with VTE, is the large molecular surface diffusivity and the non-ballistic trajectories followed by the molecules in their arrival at the surface. OVPD is particularly effective at filling preexisting voids and other surface non-uniformities, whereas VTE is ineffective due to the long mean free paths and ballistic trajectories followed by incident molecules.

At typical deposition conditions used in OVPD, the flow of the carrier gas around the substrate creates a hydrodynamic boundary layer where molecular transport is diffusion-limited. The deposition rate, deposition efficiency, and film morphology are controlled by adjusting the organic species concentration, flow hydrodynamics, and surface diffusivity. Utilizing OVPD, ordered-bulk heterojunctions grown using small molecule materials have exhibited improved series resistance over earlier spin-coated bulk heterojunction designs.

In addition to improvements in carrier mobility, series resistance, and overall efficiency over spin-coat designs, the ordered nature of OVPD-grown bulk heterojunctions can eliminate the occurrence of pockets of donor and acceptor material not electrically connected by a percolation pathway to an electrode.

However, the absorption efficiency of OVPD-grown bulk heterojunctions is spatially limited. In general, the absorption characteristics of a heterojunction are maximized by selecting donor materials and acceptor materials with different absorption spectra. If an incident photon has a wavelength near an absorption peak of the first material but not the second material, and the incident photon transits through the bulk heterojunction predominantly via the second material (e.g., passing down the length of a "finger" of the second material), there is a reduced likelihood that the photon will contribute to photocurrent.

It would be beneficial to retain the advantages of an ordered bulk heterojunction, such as the short distances for excitons to travel before disassociation, while further increasing photon-to-exciton conversion and increasing the donor-acceptor interface area where excitons disassociate.

A new structure improving upon the efficiency of existing bulk heterojunction designs includes a plurality of alternating discontinuous donor and acceptor layers embedded within a bulk heterojunction. By maximizing the number of discontinuous layers, the thickness of the structure can be made a multiple of the absorption length, theoretically enabling the structure to absorb as much as 90% of incident light of the solar spectrum.

FIGS. 9A through 9H illustrate construction of an example of the new structure. The views are of a cross section and are not drawn to scale. The scale of various features are not proportional, but are exaggerated for the purpose of demonstration.

Figure 9A:
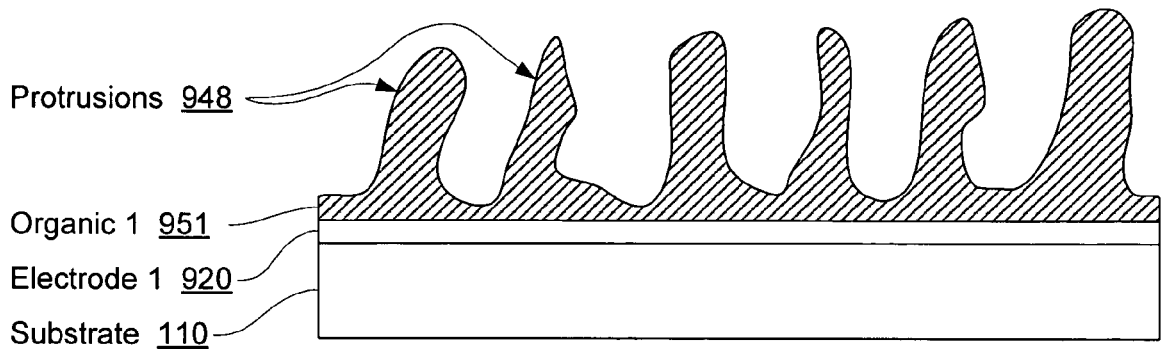
FIGS. 9A-9H illustrate a method of forming a bulk heterojunction including a plurality of discontinuous donor and acceptor layers in accordance with an embodiment of the present invention.

As illustrated in FIG. 9A, the structure begins with formation of a first layer 951 consisting essentially of a first organic semiconductor material over a first electrode 920. The first layer 951 corresponds to one of layer 252 and layer 254 in FIG. 5. The first layer 951 completely covers the first electrode 920, and includes protrusions 948. The protrusions 948 give the first layer 951 a surface area at least three times greater than an underlying cross-sectional area (e.g., the area of the plane of the underlying substrate 110); or better yet, the top of the first layer 951 has a surface area at least three times greater than a bottom of the first layer 951 (i.e., three times greater than the underlying surface). More preferably, the protrusions 948 give the first layer 951 a surface area at least five times greater than an underlying cross-sectional area; or better yet, the top of the first layer 951 has a surface area at least five times greater than the bottom of the first layer 951.

Figure 9B:
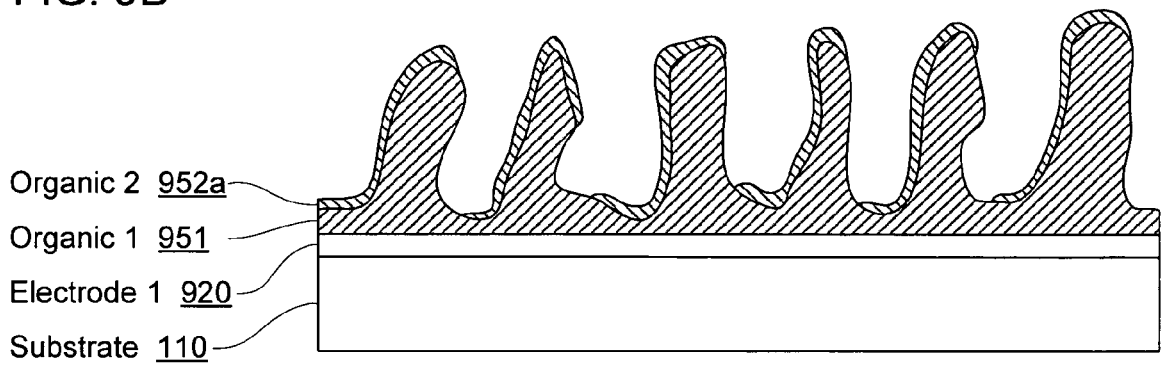

Next, as illustrated in FIG. 9B, a second layer 952*a* consisting essentially of a second organic semiconductor material is formed. The second layer 952*a* is discontinuous and in direct contact with the first layer 951. Portions of the first layer 951 remain exposed through the second layer 952*a*.

Figure 9C:
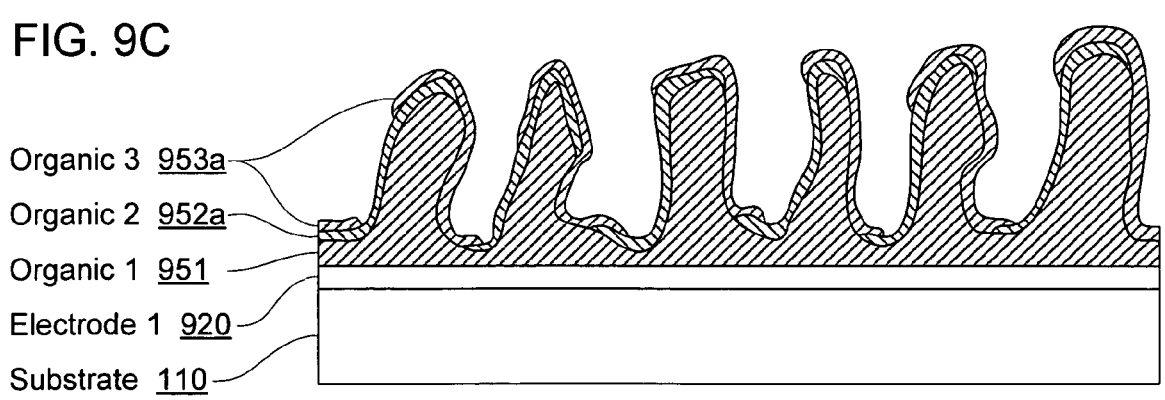

Next, as illustrated in FIG. 9C, a third layer 953*a* consisting essentially of a third organic semiconductor material is formed. The third layer 953*a* is discontinuous and in direct contact with the second layer 952*a*. Portions of the third layer 953*a* directly contact the first layer 951 through gaps in the second layer 952*a*.

Odd number organic semiconductor layers of the photoactive region 950 are of a donor-type or an acceptor type, whereas even number organic semiconductor layers are of the other type. Accordingly, the interface between each of layers 951, 952, 953, and 954 includes at least one donor-acceptor heterojunction. Similarly, contact points between layers of a same type (e.g., 951-to-953, 953-to-953, 952-to-952, 952-to-954) provide a conduction pathway for disassociated charge carriers through the structure to the respective electrode.

Figure 9D:
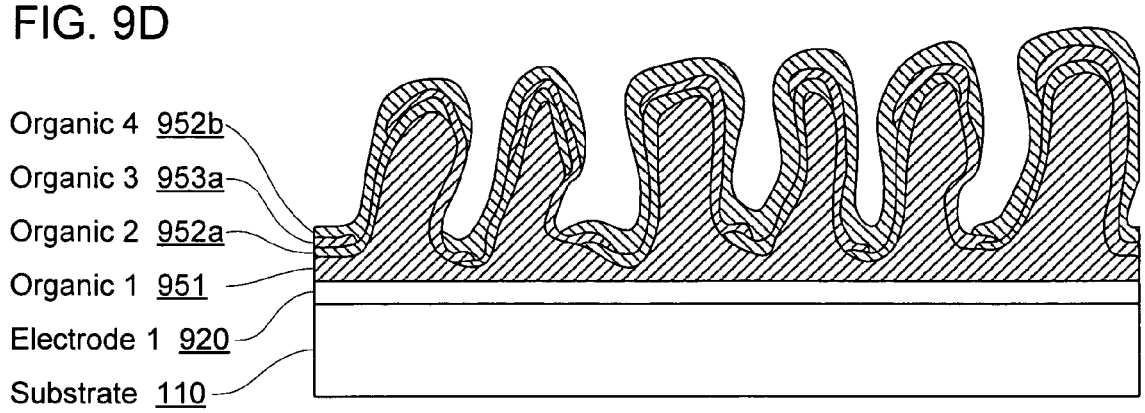
Figure 9E:
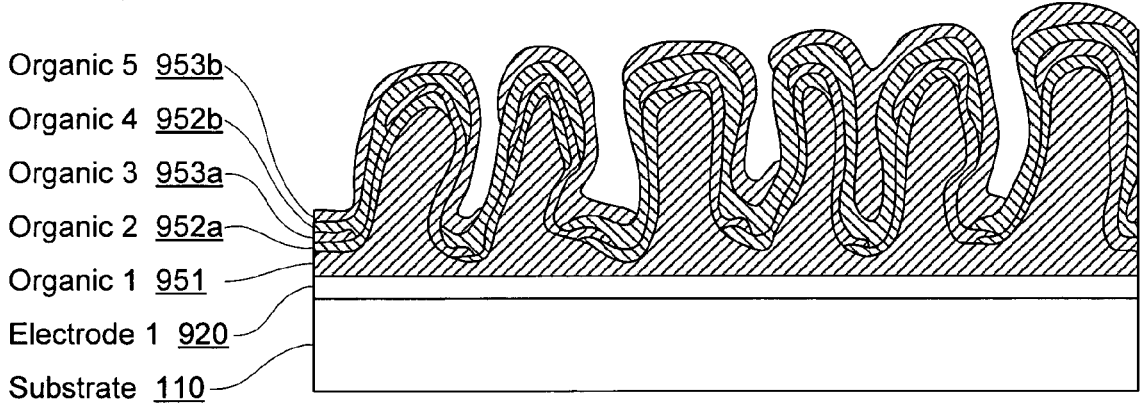
Figure 9F:
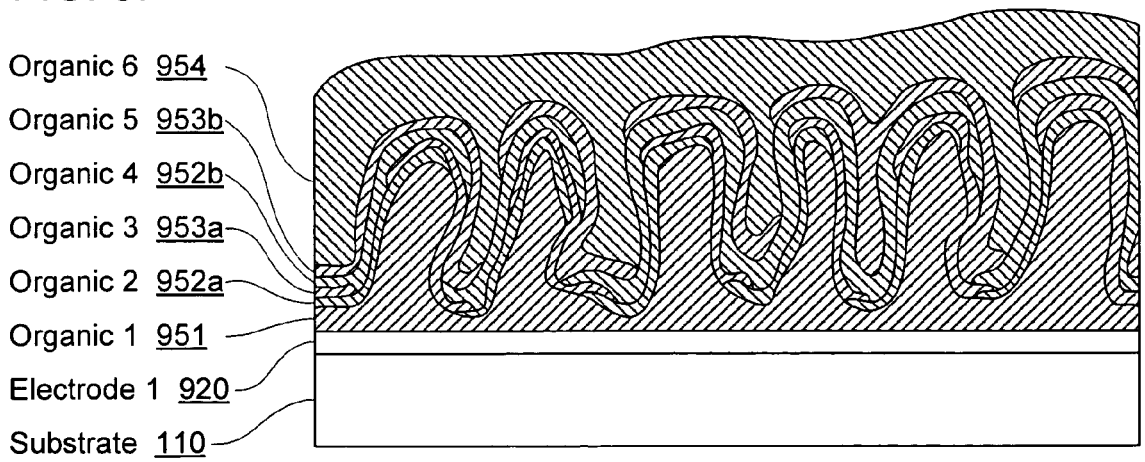

As shown in FIGS. 9D and 9E, the pattern of alternating discontinuous layers (e.g., layer 952*b* of a fourth organic semiconductor material; layer 953*b* of a fifth organic semiconductor material) repeat indefinitely until a desired overall thickness is reached. Considerations to be balanced in determining how many discontinuous layers to add include such things as series resistance, material optical absorption lengths, and whether a particular optical transparency is desired for the structure (for example, if designing a tandem structure or a photovoltaic window film). At some point, the amount of light that will reach a layer will be small due to the absorption in the preceding layers, such that further layers would contribute more to series resistance than photocurrent, thereby reducing overall efficiency.

Preferably, an even number of discontinuous layers are formed, as the discontinuous layers are covered by a sixth layer 954 consisting essentially of a sixth organic semiconductor material, having a material type opposite that of the first layer 951. The sixth layer 954 is continuous, and fills any gaps and recesses if the gaps and recesses are exposed when the sixth layer is deposited.

Figure 9G:
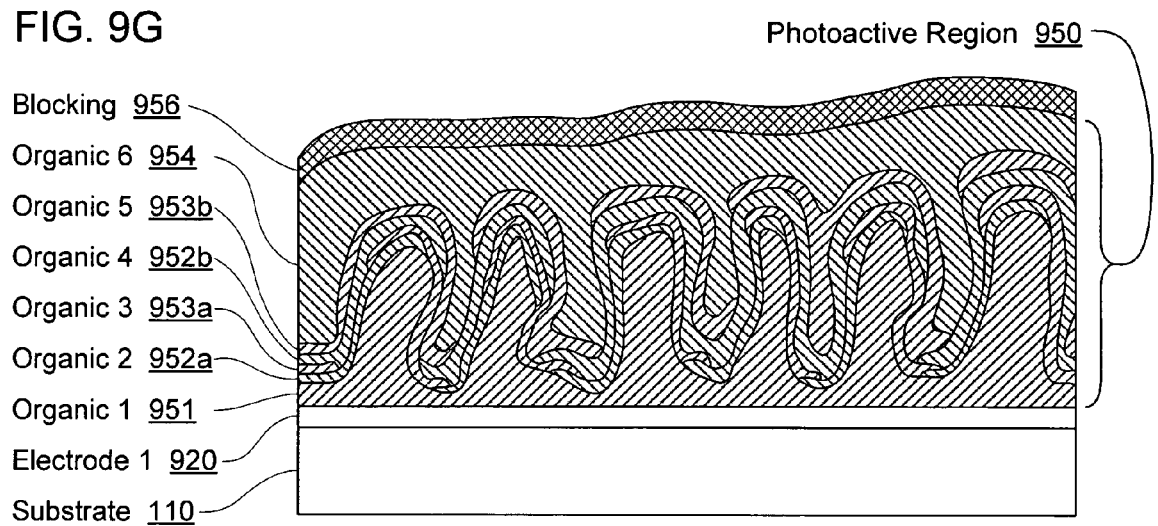

Thereafter, as illustrated in FIG. 9G, an exciton blocking layer 956 may be deposited.

Figure 9H:
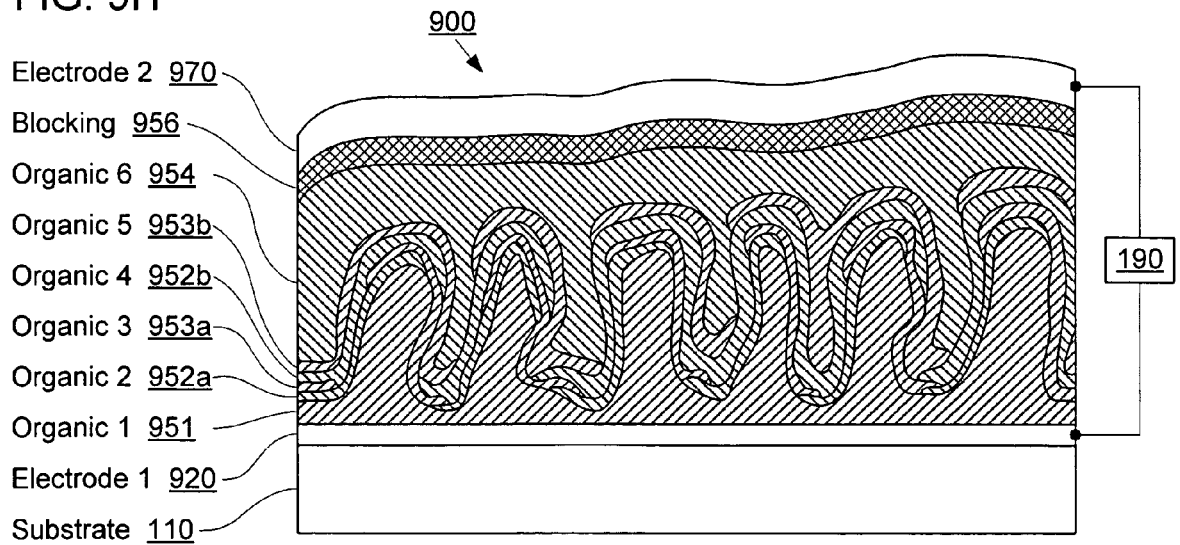

Then, as illustrated in FIG. 9H, a second electrode 970 is deposited.

The electrodes 920 and 970 are constructed as described above (i.e., a single layer or multiple layers; transparent, semi-transparent, or opaque). At least one of the electrodes 920, 970 is transparent. Electrode 920 can serve as either anode 120, or as cathode 170, with electrode 970 being the other.

Instead of electrodes, one or both of electrodes 920 and 970 may be arranged as a charge transfer layer or a charge recombination zone, such as if the photoactive region 950 serves as the photoactive region 150, 150' in a tandem device as described above with FIGS. 7 and 8.

An exciton blocking layer may be provided between the first layer 951 and the first electrode 920 (not illustrated). If an exciton blocking layer is placed between the first electrode 920 and the first layer 951, and the controlled growth method used to form the protrusions 948 relies on strain (e.g., Stranski-Krastanov, discussed further below), then the generation of interfacial strain between the lower exciton blocking layer and the first layer 951 is a design consideration when selecting the materials for the respective layers.

Interfacial strain is also a design consideration if including an electrode smoothing layer (e.g., anode smoothing layer 122). However, electrode smoothing layers increase series resistance. Using the carrier-gas delivery of organic vapor deposition techniques described herein, a smoothing layer is generally unnecessary.

The first layer 951 should be thick enough to assure continuous coverage of the first electrode 920 (thereby preventing electrical shorts), and the protrusions 948 should be wide enough to avoid breakage. At the same time, excess thickness at the base of the first layer 951 and excessively wide protrusions 948 increase series resistance and decrease the interface surface area. Preferably, a distance to an interface boundary with a layer of the opposite material type in the first organic layer 951 is no more than 2.5 exciton diffusion lengths of the first organic semiconductor material.

Similarly, within the continuous "capping" organic semiconductor layer (i.e., the sixth layer 954), a distance to an interface boundary with a layer of the opposite material type is also no more than 2.5 exciton diffusion lengths of the organic semiconductor material of the layer (e.g., the sixth organic semiconductor material in FIG. 9H). More preferably, the distance within the sixth layer 254 to an interface boundary with a layer of the opposite material type is no more than 1.5 exciton diffusion lengths.

The optimal thickness for photoactive region 950 is estimated to be around 80 nm, if constructing the continuous first and last layers (251, 254) to each provide the distance of no more than 2.5 exciton diffusion lengths to an opposite boundary, constructing the discontinuous layers (252, 253) to each provide the distance of no more than 1.5 exciton diffusion lengths to the opposite boundary, and working with donor and acceptor materials such as CuPc (copper phthalocyanine), PTCBI (3, 4, 9, 10-perylenetetracarboxylic bis-benzimidazole), and $C_{60}$.

The structure of each discontinuous organic semiconductor layer 252, 253 involves a balance between maximizing coverage to provide volume for photovoltaic conversion and providing sufficient gaps through the layer to promote conductive pathways, thereby minimizing series resistance and the occurrence of islands. Too few pathways increases the series resistance; but too little coverage reduces the benefit (photoabsorption and interface area) of the layer. Preferably a distance to an interface boundary with a layer of the opposite material type in each discontinuous layer 952, 953 is no more than 1.5 exciton diffusion lengths of the respective organic semiconductor material of the layer. The discontinuous organic semiconductor layers are preferably arranged so that portions of a plurality of the discontinuous layers overlap between each protrusion 948.

Within the photoactive region 950, each donor layer may be formed of a same material. However, some or all of the donor layers may be formed of different materials. If different donor materials are used, the donor materials should be arranged so that the HOMO levels are favorable to hole conduction to the anode 120. A donor layer closer to the anode 120 should have a HOMO level no more than 3 kT lower than an adjacent donor layer further from the anode 120 (k being the Boltzmann contant and T being the operating temperature). More preferably, a donor layer closer to the anode 120 should have a HOMO level equal to or higher than that of an adjacent donor layer further from the anode 120.

Likewise, within the photoactive region 950, each acceptor layer may be formed of a same material. However, some or all of the acceptor layers may be formed of different materials. If different materials are used, the acceptor materials should be arranged so that the LUMO levels are favorable to electron conduction to the cathode 170. An acceptor layer closer to the cathode 170 should have a LUMO level no more than 3 kT higher than an adjacent acceptor layer further from the cathode 170. More preferably, an acceptor layer closer to the cathode 170 should have a LUMO level equal to or lower than that of an adjacent acceptor layer further from the cathode 170.

Operating temperatures for organic photosensitive devices are commonly specified as having an operating range of T=−40° C. to +100° C., with a nominal operating temperature approximated as +300° K. Using the nominal operating temperature, 3 kT=0.078 eV (i.e., 3×1.381 E−23 (J/K)/1.602 E−19 (J/eV)×300° K).

Each respective organic semiconductor layer 951, 952, 953, 954 may or may not be doped. The "essential" material of each layer is whatever component or components define the character of the respective layer as either donor or acceptor. In other words, the "essential" material may be a matrix material or materials, a dopant, or a combination thereof.

The first organic semiconductor layer 951 may be grown using any controlled-growth technique, such as those employed to grow organic bulk heterojunctions.

Growth of the first organic semiconductor layer 951 can be initiated with or without a wetting layer of the first organic semiconductor material. An advantage of using a wetting layer formed by either OVPD or organic vapor jet deposition (OVJD) is that both processes enable the reliable and repeatable formation of a thin conformal layer, making it possible to use rough electrode materials such as $SnO_2$ without an appreciable increase in series resistance and without shorts. There are several advantages to using a rough electrode material, including lower cost and increased surface area.

Cost can be reduced because materials such as $SnO_2$ are less expensive than smoother substrate materials (such as indium tin oxide), and because process steps to smooth the substrate can be eliminated (e.g., formation of a smoothing layer 122). Surface area is increased because the conformal nature of the wetting layer enables the surface roughness to carry through as a feature of the first organic semiconductor layer 951. Series resistance is lowered because the conformal layer can reliably be made very thin. Preferably, the rough electrode has an exposed surface with a root mean square roughness of at least 30 nm and a height variation of at least 200 nm.

Any number of less-expensive transparent conductive oxides (TCOs) with high surface roughness are available. Examples of other less-expensive rough transparent conductive oxides include ZnO, and $SnO_2$. Preferably, the conductivity of the rough TCO is increased by doping, such as with aluminum-doped ZnO (ZnO:Al), antimony-doped $SnO_2$ ($SnO_2$:Sb), fluorine-doped ZnO (ZnO:F), and gallium-doped ZnO (ZnO:Ga). In addition, as an alternative to TCOs, a transparent rough transparent oxide with exceptional conductivity properties can be formed from carbon nanotubes in a small molecule or polymer matrix. If desired, more expensive rough TCOs may also be used, such as GaO and InGaO.

Each of vacuum thermal deposition (VTE), organic molecular beam deposition (OMBD), and inkjet printing have been unreliable for forming thin (i.e., a few molecules thick) conformal layers over a large surface areas of a rough electrode material, as known in the art. Thin layers formed by these methods typically have uneven thicknesses and are prone to the creation of short circuits (when an anode directly contacts the acceptor or when a cathode directly contacts the donor).

An example of a controlled-growth method by which the protrusions 948 can be grown is the Stranski-Krastanov layer-plus-island growth, as described (among other places) in "Ultrathin Organic Films Grown by Organic Molecular Beam Deposition and Related Techniques" by Forrest, Chemical Reviews Vol. 97, No. 6, 1793-1896 (1997), which is incorporated herein by reference. A conformal strained polycrystalline wetting layer is grown to a thickness where coverage is continuous and the molecules begin to relax (for most material combinations, this thickness is between 10 and 20 nm). Then the substrate temperature is raised and the chamber pressure is lowered (relative to conditions used for conformal growth) to form the protrusions by equilibrium-growth, taking advantage of the high surface diffusivity possible with OVJD and OVPD. The increased surface temperature results in molecules skimming along the surface of the wetting layer until a point of energy equilibrium is reached (usually toward a middle of one of the polycrystalline domains where the wetting layer is most relaxed). The surface energy conditions favor further molecules bonding to these equilibrium-point nucleation sites, rather than the wetting layer itself, generating protrusions 948. The higher the strain in the wetting layer, the narrower the protrusions 948 are for any given material. The resulting protrusions 948 have very good crystallinity, which is favorable to high carrier mobility and low series resistance. Protrusions can be grown to heights as long as a micron, whereas protrusion cross-sections are on the order of the exciton diffusion length of the material—around fifty nanometers.

Another example of a controlled growth process by which protrusions 948 can be grown is nucleation-by-condensation. Using OVJD or OVPD, the chamber pressure is increased to cause the molecules to cluster while still in the gas stream. The surface temperature of the substrate is lowered to decrease surface diffusivity, such that the clusters stick where they land. The result is protrusions having heights up to around one hundred nanometers, with cross-sections between ten to one hundred nanometers. The height and width dimensions tend to be similar to be on order of the exciton diffusion length of the material; for example, the height and width of the protrusions formed with CuPc were around 30 to 40 nm. The growth process is easier to control than the Stranski-Krastanov method, but crystallinity in the protrusions 948 is reduced (mobility for a same material is approximately $1/10$ that achieved with Stranski-Krastanov). This method can be performed with or without a conformal wetting layer, although the wetting layer is preferred (especially with a rough electrode). Mushroom-shaped protrusions that maximize surface area are easily formed with this method, since by morphology control, incoming clusters can be made to clump to the first surface they contact.

The discontinuous layers are made discontinuous by selective (patterned) deposition, by angling the substrate during deposition, by making the layers very thin (e.g., a few molecules thick), or a combination thereof. The discontinuous layers may be formed using most any method, including OVPD, OVJD, VTE, OMBD, or inkjet printing. However, OVJD and OVPD are preferred, since VTE and inkjet printing provide imprecise control over film-thickness, and since OMBD can be prohibitively expensive.

OVJD can be performed in a same chamber as OVPD (e.g., hot-walled chamber, carrier gas delivery, similar pressures) and provides the highest degree of control. Whereas molecules have fairly random vectors in OVPD, OVJD delivers collimated jets of organic vapor and carrier gas (similar to the directional nature of VTE and OMBD, but having a hydrodynamic flow at the deposition surface). For a background discussion of OVJD, see U.S. Patent Application Publication 2004/0048000A1 by Shtein, entitled "Device and Method For Organic Vapor Jet Deposition," incorporated herein by reference.

OVJD and OVPD can be used for the deposition of small molecule materials, monomers, oligomers, and dendrimers. Since OVJD and OVPD heat the molecular source, these processes are generally unsuitable for use with polymers (which thermally decompose when heated).

A further consideration when choosing the deposition method for depositing the discontinuous layers is the desired to avoid isolated islands of donor/acceptor material that do not contribute to photocurrent (but do increase series resistance). Selective deposition (e.g., using a shadow mask placed close to the substrate; targeted pulsing, angling and/or positioning the molecular beam or nozzles), and tilting the substrate between layers all provide a degree of control that can help minimize the occurrence of islands. Selectivity may also include changing the position of the substrate relative to the gas flow during the deposition process.

Another consideration when choosing the deposition method for the discontinuous layers is the desire to prevent voids in the finished device. Although FIGS. 9A-9H present the protrusions 948 as neat columns, this is a design choice: more complex structures are readily obtainable. If the protrusions are made tall (e.g., approaching a micron), the protrusions may twist and bend, forming covered pockets. Similarly, if in an effort to maximize surface area, the protrusions are made in mushrooms shapes (i.e., by morphology control during growth), covered pockets are created that are at risk for becoming voids in a finished device. While VTE and OMBD may be used to form the discontinuous layers if the shape of the protrusions 948 are simple, a shortcoming of both VTE and OMBD is the poor ability to fill pockets that exist with more complex protrusions 948. Filling pockets is also a shortcoming of ink-jet (solvent-based) printing. However, the carrier-gas flow dynamics of both OVPD and OVJD are able to provide excellent coating and coverage of such pockets.

In general, OVPD is less selective than OVJD and is better at filling voids. However, the flow dynamics of OVJD can be modified to promote void filling by inter alia lowering the pressure in the deposition chamber, lowering flow rate of the carrier gas, moving the target away from the nozzles, and increasing the surface temperature of the target. While locally, this makes an OVJD deposition less selective, a high degree of overall selectivity can be retained by controlling over which areas of the target the nozzles are activated.

Figure 10A:
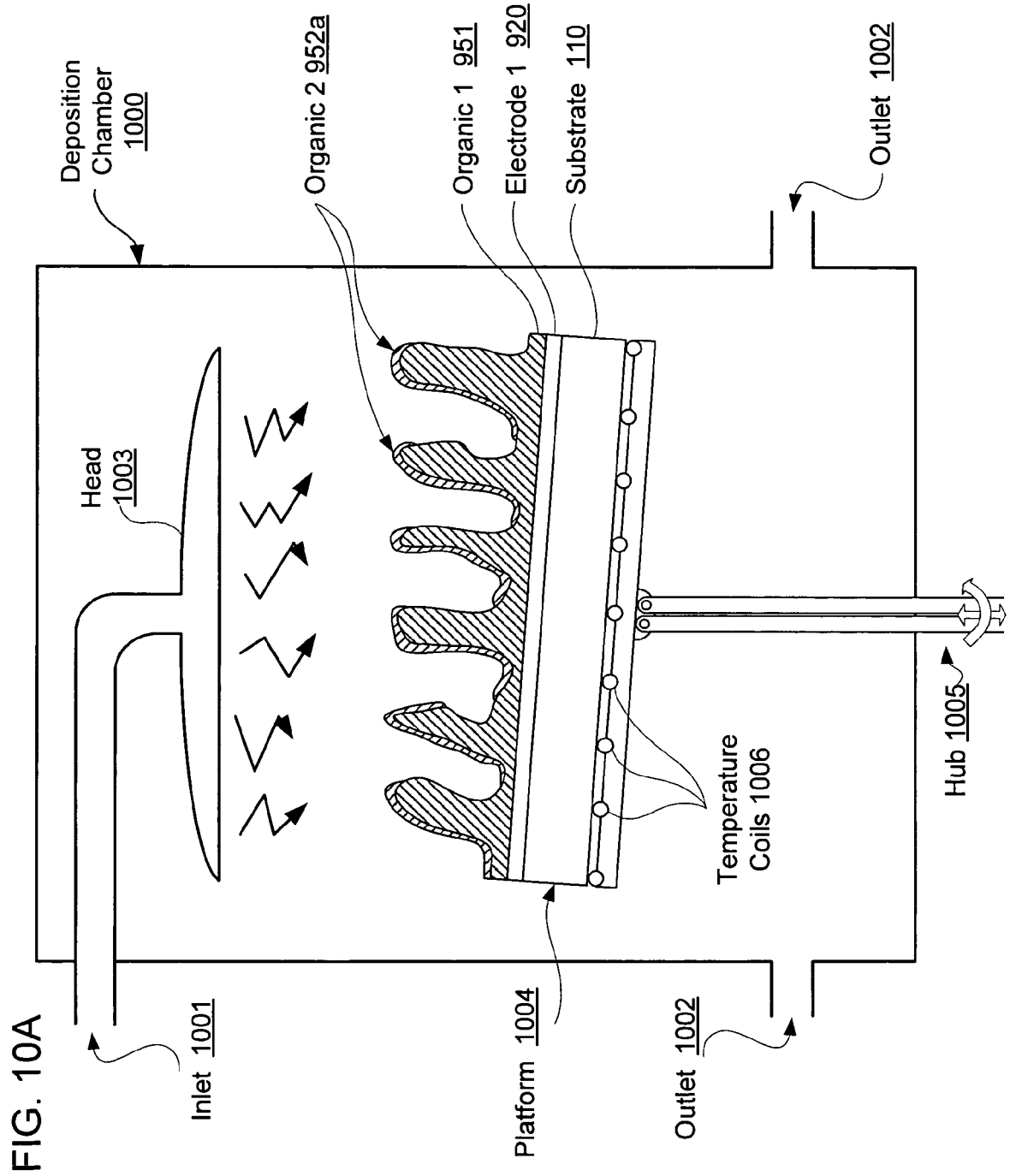
FIGS. 10A and 10B demonstrate formation of discontinuous layers by organic vapor phase deposition.
Figure 10B:
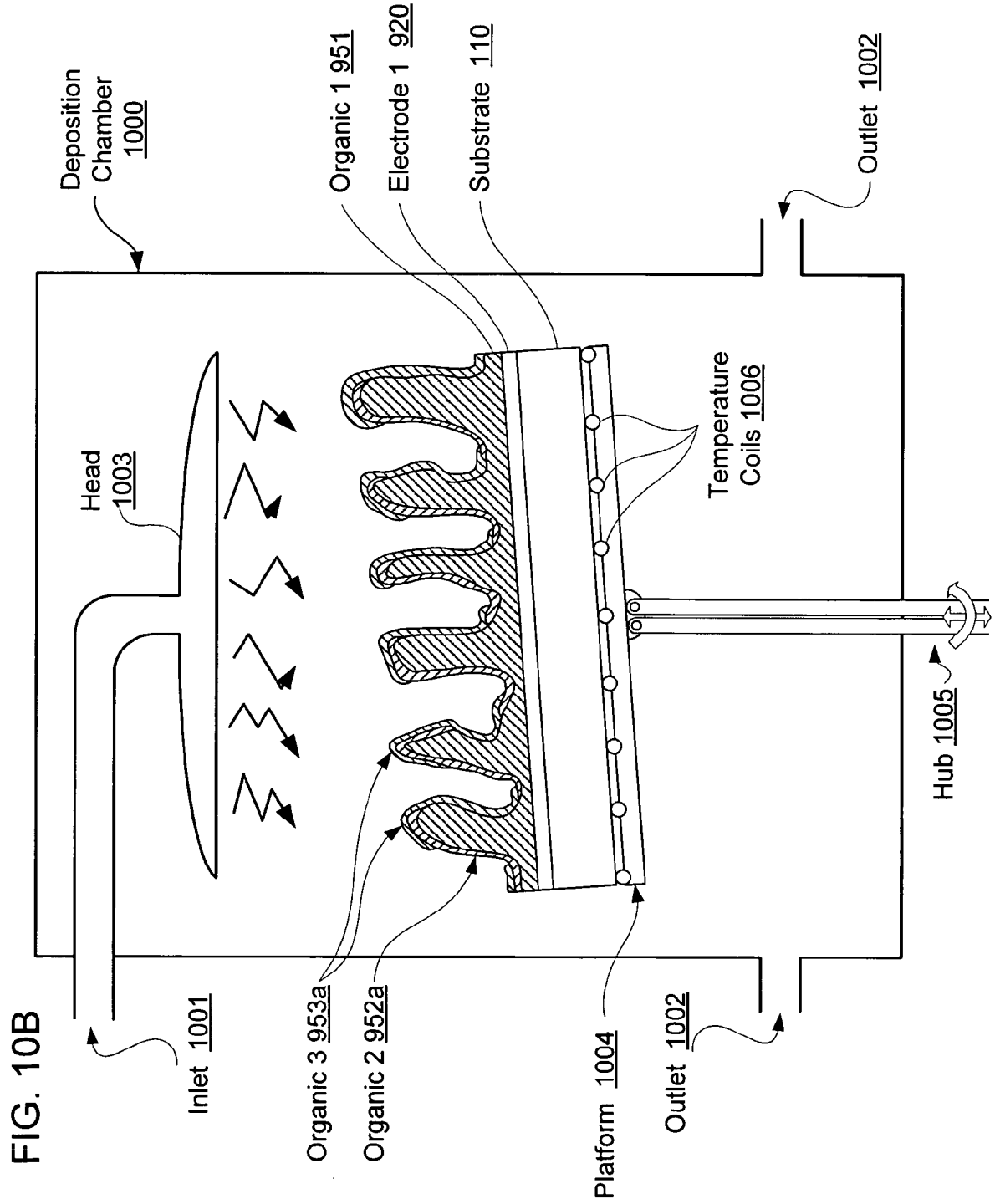

FIGS. 10A and 10B illustrate examples of selectively depositing discontinuous layers by OVPD. The deposition chamber 1000 includes an inlet 1001 connected to a gas-delivery head 1003, and outlets 1002. The platform 1004 on which the substrate 110 is mounted includes temperature coils 1006 through which fluid is passed to heat or cool the substrate 110. The platform 1004 is mounted on a hub 1005 that allows the platform to be raised, lowered, rotated, and/or tilted. Although not illustrated, the walls of the deposition chamber 1000 are heated, and other apparatus may be included to control the temperature of the substrate (e.g., piezo-electric cooling elements; infrared heaters).

In view of the short mean-free path with OVPD in the gas phase (<1 cm), selectivity can be improved by decreasing the distance between the substrate 110 and the gas-delivery head 1003. FIGS. 10A and 10B also demonstrate tilting the substrate to promote selective deposition and discontinuous coverage.

Figure 11:
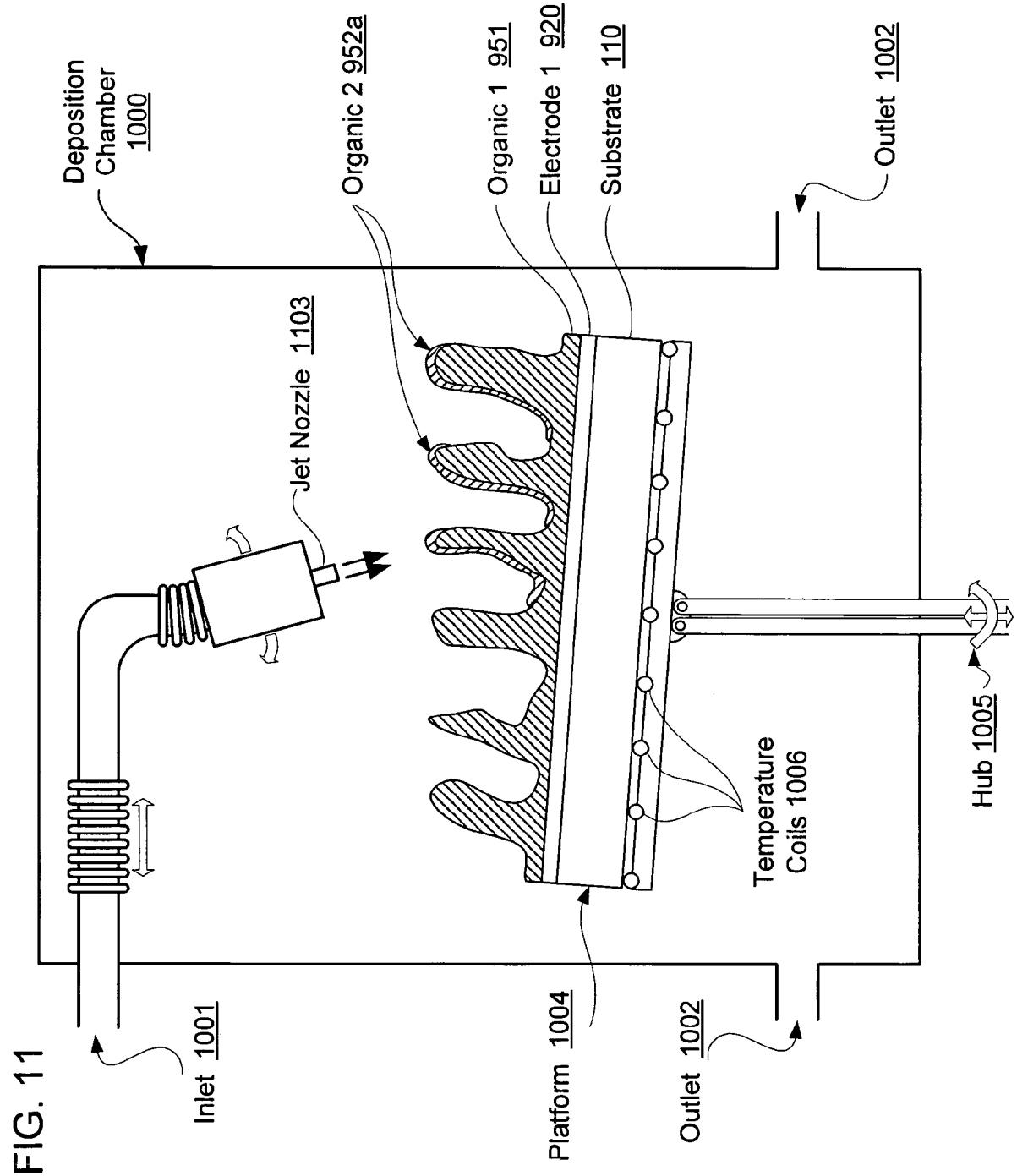
FIG. 11 demonstrates formation of a discontinuous layer by organic vapor jet deposition.

FIG. 11 illustrates an example of selectively depositing a discontinuous layer using OVJD. For OVJD, the jet nozzle 1103 may be configured to move and/or angle. With the ability to selectively target and pulse the collimated jet of material, the jet can be rastered across the substrate. Although shown with only one jet nozzle, the chamber 1000 can also be configured with a plurality of jet nozzles 1103 to increase throughput. In addition, as noted above, a chamber may be configured with both an OVPD head 1003 and one-or-more OVJD nozzles 1103.

As described above, organic photosensitive devices of the present invention may be used to generate electrical power from incident electromagnetic radiation (e.g., photovoltaic devices) or may be used to detect incident electromagnetic radiation (e.g., a photodetector or photoconductor cell). The materials, structures and fabrications approaches described herein may have applications in devices other than organic photovoltaic cells. For example, other optoelectronice devices such as organic photodetectors, organic photosensors, and organic light-emitting diodes may employ the materials, structures and fabrication approaches. More generally, organic devices, such as organic transistors, may employ the materials, structures and fabrication approaches Specific examples of the invention are illustrated and/or described herein. However, it will be appreciated that modifications and variations of the invention are covered by the above teachings and within the purview of the appended claims without departing from the spirit and scope of the invention.

What is claimed is:

1. A method of fabricating a photosensitive optoelectronic device, comprising:
    depositing a first organic semiconductor material on a first electrode to form a continuous first layer having protrusions, a side of the first layer opposite the first electrode having a surface area at least three times greater than an underlying lateral cross-sectional area;
    depositing a second organic semiconductor material directly on the first layer to form a discontinuous second layer, portions of the first layer remaining exposed;
    depositing a third organic semiconductor material directly on the second layer to form a discontinuous third layer, portions of at least the second layer remaining exposed;
    depositing a fourth organic semiconductor material on the third layer to form a continuous fourth layer, filling any exposed gaps and recesses in the first, second, and third layers; and
    depositing a second electrode on the fourth layer,
    wherein at least one of the first electrode and the second electrode is transparent, and
    the first and third organic semiconductor materials are both of a donor-type or an acceptor-type relative to second and fourth organic semiconductor materials, which are of the other material type.

2. The method of claim 1, wherein portions of the third layer directly contact the first layer through gaps in the second layer.

3. The method of claim 2, wherein portions of the fourth layer directly contact the second layer through gaps in the third layer.

4. The method of claim 1, wherein:
    from any point within the first layer, a distance to an interface boundary with a layer of an opposite material type is no more than 2.5 exciton diffusion lengths of the first organic semiconductor material,
    from any point with the second layer, a distance to an interface boundary with a layer of an opposite material type is no more than 1.5 exciton diffusion lengths of the second organic semiconductor material,
    from any point with the third layer, a distance to an interface boundary with a layer of an opposite material type is no more than 1.5 exciton diffusion lengths of the third organic semiconductor material, and
    from any point in the fourth layer, a distance to an interface boundary with a layer of opposite material type is no more than 2.5 exciton diffusion lengths of the fourth organic semiconductor material.

5. The method of claim 1, wherein the surface area of the side of the first layer opposite from the first electrode is at least three times greater than a surface area of a side of the first layer facing the first electrode.

6. The method of claim 1, the side of the first layer opposite the first electrode having a surface area at least five times greater than the underlying lateral cross-sectional area.

7. The method of claim 6, wherein the surface area of the side of the first layer opposite from the first electrode is at least three times greater than a surface area of a side of the first layer facing the first electrode.

8. The method of claim 1, wherein the first organic semiconductor material and the third organic semiconductor material are a same material, and the second organic semiconductor material and the fourth organic semiconductor material are a same material.

9. The method of claim 1, wherein the first organic semiconductor material and the third organic semiconductor material are a different material, and the second organic semiconductor material and the fourth organic semiconductor material are a different material.

10. The method of claim 1, wherein depositing the first organic semiconductor material includes delivery of a vapor of the first organic semiconductor material in an inert carrier gas.

11. The method of claim 10, wherein the first electrode has an exposed surface having a root mean square roughness of at least 30 nm and a height variation of at least 200 nm.

12. A photosensitive optoelectronic device, comprising:
    a first electrode and a second electrode, at least one of the first electrode and the second electrode being transparent; and
    a plurality of organic photoactive layers disposed between the first electrode and the second electrode, the plurality of organic photoactive layers comprising:
        a first layer consisting essentially of a first organic semiconductor material, the first layer being continuous and having protrusions, a side of the first layer that faces a second layer having a surface area at least three times greater than a lateral cross-sectional area;
        the second layer consisting essentially of a second organic semiconductor material, the second layer being discontinuous and in direct contact with the first layer, portions of the first layer coinciding with gaps in the second layer;
        a third layer consisting essentially of a third organic semiconductor material, the third layer being discontinuous and in direct contact with the second layer, portions of the second layer coinciding with gaps in the third layer; and
        a fourth layer consisting essentially of a fourth organic semiconductor material, the fourth layer being continuous and on the third layer, the fourth layer filling gaps and recesses in the other organic photoactive layers if the gaps and recesses are exposed to the fourth layer,
    wherein the first and third organic semiconductor materials are both of a donor-type or an acceptor-type relative to second and fourth organic semiconductor materials, which are of the other material type.

13. The photosensitive optoelectronic device of claim 12, wherein portions of the third layer are in direct contact with the first layer through gaps in the second layer.

14. The photosensitive optoelectronic device of claim 13, wherein portions of the fourth layer are in direct contact with the second layer through gaps in the third layer.

15. The photosensitive optoelectronic device of claim 12, wherein:
    from any point within the first layer, a distance to an interface boundary with a layer of an opposite material type is no more than 2.5 exciton diffusion lengths of the first organic semiconductor material,
    from any point with the second layer, a distance to an interface boundary with a layer of an opposite material type is no more than 1.5 exciton diffusion lengths of the second organic semiconductor material, from any point with the third layer, a distance to an interface boundary with a layer of an opposite material type is no more than 1.5 exciton diffusion lengths of the third organic semiconductor material, and from any point in the fourth layer, a distance to an interface boundary with a layer of opposite material type is no more than 2.5 exciton diffusion lengths of the fourth organic semiconductor material.

16. The photosensitive optoelectronic device of claim 12, the surface area of the side of the first layer facing the second layer being at least three times greater than a surface area of an opposite side of the first layer.

17. The photosensitive optoelectronic device of claim 12, the side of the first layer that faces the second layer having a surface area at least five times greater than a lateral cross-sectional area.

18. The photosensitive optoelectronic device of claim 17, the surface area of the side of the first layer facing the second layer being at least three times greater than a surface area of an opposite side of the first layer.

19. The photosensitive optoelectronic device of claim 12, wherein the first organic semiconductor material and the third organic semiconductor material are a same material, and the second organic semiconductor material and the fourth organic semiconductor material are a same material.

20. The photosensitive optoelectronic device of claim 12, wherein the first organic semiconductor material and the third organic semiconductor material are a different material, and the second organic semiconductor material and the fourth organic semiconductor material are a different material.

21. The photosensitive optoelectronic device of claim 20, wherein one of the first electrode and the second electrode is an anode and the other is a cathode, and wherein among the plurality of organic photoactive layers, a respective organic semiconductor material of each donor-type layer that is closer to the anode has a HOMO no more than 0.026 eV lower than that of an adjacent donor-type layer further from the anode, and a respective organic semiconductor material of each acceptor-type layer that is closer to the cathode has a LUMO no more than 0.026 eV higher than that of an adjacent acceptor-type material further from cathode.

22. The photosensitive optoelectronic device of claim 21, wherein among the plurality of organic photoactive layers, a respective organic semiconductor material of each donor-type layer that is closer to the anode has a HOMO that is equal to or higher than that of an adjacent donor-type layer further from the anode, and a respective organic semiconductor material of each acceptor-type layer that is closer to the cathode has a LUMO that is equal to or lower than that of an adjacent acceptor-type material further from the cathode.

23. The photosensitive optoelectronic device of claim 12, wherein the first electrode has a surface, facing the plurality of organic photoactive layers, with a root mean square roughness of at least 30 nm and a height variation of at least 200 nm.

24. The photosensitive optoelectronic device of claim 12, the plurality of organic photoactive layers further comprising a fifth layer and a sixth layer between the third layer and the fourth layer, the fifth layer consisting essentially of a fifth organic semiconductor material, the fifth layer being discontinuous and in direct contact with the third layer, portions of the third layer coinciding with gaps in the fifth layer, the sixth layer consisting essentially of a sixth organic semiconductor material, the sixth layer being discontinuous and in direct contact with the fifth layer, portions of the fifth layer coinciding with gaps in the sixth layer, and wherein the fifth organic semiconductor material is of same material type as the first and third organic semiconductor materials, the sixth organic semiconductor material being of the other material type.

* * * * *